US007148753B1

(12) United States Patent
Garlepp et al.

(10) Patent No.: US 7,148,753 B1
(45) Date of Patent: Dec. 12, 2006

(54) METHOD AND APPARATUS FOR GENERATING A CLOCK SIGNAL IN HOLDOVER MODE

(75) Inventors: Bruno W. Garlepp, Milpitas, CA (US); Gerard Pepenella, Manorville, NY (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/453,990

(22) Filed: Jun. 4, 2003

Related U.S. Application Data

(60) Provisional application No. 60/462,266, filed on Apr. 11, 2003.

(51) Int. Cl.
*H03L 7/00* (2006.01)
(52) U.S. Cl. .............................. 331/2; 331/17; 331/1 A; 331/49; 327/156; 327/159
(58) Field of Classification Search .................... 331/2, 331/1 A, 17, 49; 327/156, 159
See application file for complete search history.

(56) References Cited

U.S. PATENT DOCUMENTS

| | | | | |
|---|---|---|---|---|
| 5,053,726 A | * | 10/1991 | Christopher et al. | 331/34 |
| 5,534,822 A | * | 7/1996 | Taniguchi et al. | 331/2 |
| 5,572,167 A | * | 11/1996 | Alder et al. | 331/2 |
| 5,726,607 A | * | 3/1998 | Brede et al. | 331/2 |
| 6,804,316 B1 | * | 10/2004 | Shectman | 375/368 |

OTHER PUBLICATIONS

Raltron, "Synchronous Equipment OCXO Based Stratum 3 Clock Unit—SY01-S3", May 20, 2002.*

* cited by examiner

*Primary Examiner*—Joseph Chang
(74) *Attorney, Agent, or Firm*—Zagorin O'Brien Graham LLP

(57) ABSTRACT

A first phase-locked loop circuit that includes a crystal oscillator, receives a reference clock signal and supplies a first phase-locked loop output signal based on the reference clock during normal operational mode and a stored value in holdover mode. A second phase-locked loop circuit receives the first phase-locked loop output signal and utilizes the first phase-locked loop output signal when generating an output clock in holdover mode. The second phase-locked loop utilizes the first phase-locked loop output signal during operation in the holdover mode to generate the output clock and utilizes the reference clock during normal operational mode to generate the output clock. Alternatively, the second phase-locked loop utilizes the first phase-locked loop output signal both during operation in the holdover mode and during normal operational mode to generate the output clock. The first phased-lock loop circuit may include a low pass filter coupled to the loop filter, which supplies a low pass filtered signal to the crystal oscillator in holdover mode. The first phased-lock loop circuit may include a low pass filter and a delay circuit coupled to the loop filter, which supply a delayed and low pass filtered signal to the crystal oscillator in holdover mode.

18 Claims, 3 Drawing Sheets

METHOD AND APPARATUS FOR GENERATING A CLOCK SIGNAL IN HOLDOVER MODE

CROSS-REFERENCE TO RELATED APPLICATION(S)

This application claims benefit under 35 U.S.C. § 119(e) of provisional application 60/462,266, filed Apr. 11, 2003, entitled "Method and Apparatus for Generating a Clock Signal in Holdover Mode", naming Bruno W. Garlepp and Gerard Pepenella as inventors.

BACKGROUND

1. Field of the Invention

This application relates to clock generation in high speed systems and more particularly to generation of clocks when a reference signal used in generating those clocks is lost.

2. Description of the Related Art

High speed communication systems require high speed clocks for transmission and reception of information. For example, in optical communication systems, line cards compliant with standards such as Synchronous Optical Network (SONET) or Synchronous Digital Hierarchy (SDH) (the European counterpart to SONET), utilize clock generation circuits to generate high speed clocks used in data transmission and reception. In a typical clock generation circuit in such SONET (or SDH) compliant systems, a phase-locked loop (PLL) receives a synchronization input reference clock and generates one or more high speed clocks suitable for use in transmitting or receiving data. According to one aspect of such a communication system, when the synchronization input reference clock is lost, the system enters a mode known as "holdover" mode and outputs a clock based on a previously valid reference clock signal.

The accuracy with which the clock generation circuit provides the clock in holdover mode is typically specified in the SONET or SDH standards. For example, GR-1244-CORE specifies Stratum 3 holdover initial frequency error at $\pm 50 \times 10^{-9}$ (0.05 ppm). The clock generation circuit tries to maintain the output clock during holdover mode at a frequency based on a previous reference clock signal. While generating the clock in holdover mode, the phase-locked loop typically no longer uses feedback to generate the output clock. However, the clock generated in holdover mode may still drift to such an extent as to fail to meet the holdover requirements. For example, certain phase-locked loops may find it difficult to meet holdover requirements because the voltage controlled oscillators utilized in such systems have too much frequency variation over temperature (e.g., 100 ppm/° C.). In addition, certain phase-locked loops, for example, phase-locked loops using digital techniques as described in application Ser. No. 09/902,541, filed Jul. 10, 2001, entitled "Digitally-Synthesized Loop Filter Circuit Particularly Useful for a Phase-Locked Loop", find it difficult to meet the initial accuracy required when first entering holdover due to truncation error.

It would be desirable to provide techniques that improve accuracy of clocks generated in holdover mode by, e.g., reducing susceptibility to frequency drift.

SUMMARY

Accordingly, in one embodiment the invention provides an apparatus for generating a clock signal. The apparatus includes a first phase-locked loop circuit that includes a crystal oscillator coupled to receive a reference clock and to supply a first phase-locked loop output signal during normal operational mode based on the reference clock and on a stored value during holdover mode, the stored value corresponding to reference clocks received prior to entering holdover mode. A second phase-locked loop circuit receives the first phase-locked loop output signal and utilizes the first phase-locked loop output signal when generating an output clock in holdover mode.

In one embodiment, the second phase-locked loop is coupled to utilize the first phase-locked loop output signal during operation in the holdover mode to generate the output clock and utilizes the reference clock during normal operational mode to generate the output clock.

In another embodiment, the second phase-locked loop is coupled to utilize the first phase-locked loop output signal both during operation in the holdover mode and during normal operational mode to generate the output clock.

In an embodiment, the first phased-locked loop circuit includes a phase detector coupled to receive the reference clock and a feedback signal from the crystal oscillator, a loop filter coupled to the phase detector, and a low pass filter coupled to the loop filter, which supplies a low pass filtered signal to the crystal oscillator in holdover mode. A selector circuit couples the crystal oscillator to the low pass filtered signal in holdover mode and to the loop filter in normal operational mode.

In another embodiment, the first phase-locked loop circuit includes a low pass filter coupled to the loop filter and a delay circuit coupled to the low pass filter. The delay circuit and the low pass filter combine to supply a delayed filtered signal indicative of a desired output frequency of the crystal oscillator in holdover mode. A selector circuit is responsive to couple the crystal oscillator to the delayed filtered signal in holdover mode and to couple the crystal oscillator to an output of the loop filter in normal operational mode.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Improved holdover clocks can be generated by combining a phase-locked loop (PLL) utilizing an LC-based or ring based voltage controlled oscillator (VCO) with a phase-locked loop that utilizes a crystal oscillator. The use of the crystal oscillator provides good stability over temperature, thus improving holdover performance. A first topology utilizing two PLLs, one of which includes a crystal oscillator is illustrated in FIG. 1.

Figure 1:
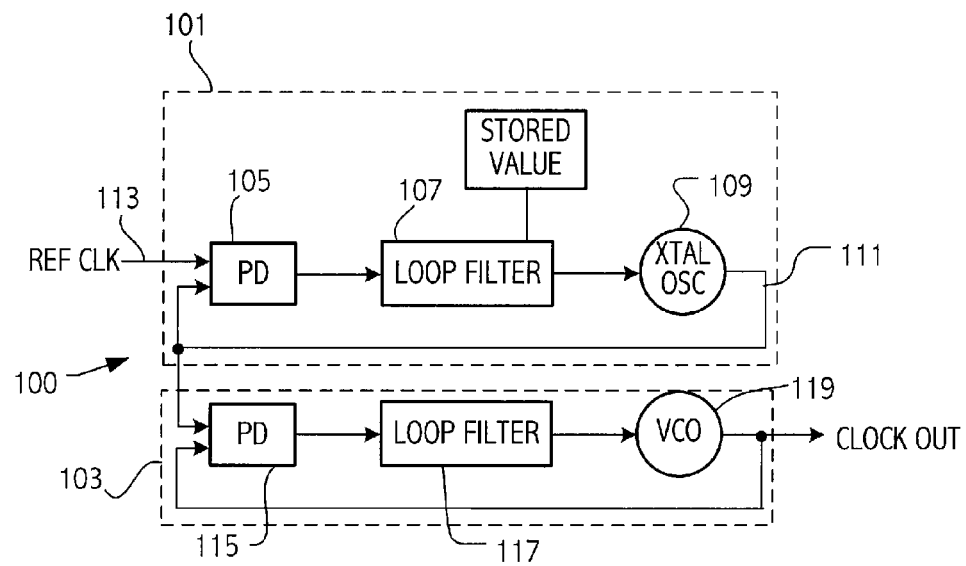
FIG. 1 shows an embodiment in which two PLLs are connected in series.

FIG. 1 shows an embodiment 100 in which a first PLL 101 is connected in series with a second PLL 103. The first PLL 101 includes phase or phase-frequency detector (PD) 105, loop filter 107 and crystal oscillator 109, which in a preferred embodiment is a voltage-controlled, temperature compensated crystal oscillator. The output signal from PLL 101 supplied on node 111, is fed back to phase detector 105 so that the phase detector 101 can track the reference clock in normal operational mode. The reference clock is supplied to PLL 101 on input node 113.

The second PLL 103 receives the output 111 of the first PLL 101 into phase and frequency detector 115. The output 111 functions as a reference input. The second PLL 103 also includes loop filter 117 and a voltage controlled oscillator (VCO) 119, which may be implemented, e.g., as a ring oscillator or utilizing an LC (tank) circuit.

In the topology illustrated in FIG. 1, PLL 101 locks to the reference clock supplied on node 113. PLL 103 then locks to the output of PLL 101 supplied on node 111. Since PLL 101 utilizes a crystal oscillator, which has good stability, its bandwidth can typically be much lower than that of PLL 103. Therefore PLL 101 can track the average frequency of the reference clock supplied on node 113 very accurately. PLL 103 is typically used to multiply the output of PLL 101 to a higher frequency. That allows the use of a lower frequency crystal oscillator, which reduces cost since high frequency crystal oscillators are expensive.

When a holdover condition occurs, that is, when the reference clock fails, which may be indicated by a loss of signal condition indicator, the loop filter of PLL 101 is "frozen" such that a control voltage used to drive the crystal oscillator no longer tracks changes to the reference signal, and the frozen output of the loop filter holds the output frequency of the crystal oscillator steady. That is loop filter outputs are held to value corresponding to clocks received prior to entering the holdover mode so no updating of loop filter outputs take place. PLL 103 continues to behave normally. That is, it tracks the input supplied from node 111. Since the crystal oscillator is stable over temperature and time, it determines the holdover stability of the system. Thus, PLL 101 tunes the output of the crystal oscillator 109 while the reference clock is good such that there is virtually no phase or frequency change or "hit" when entering holdover mode. The initial accuracy of the clock generated in holdover mode is very good. The clock generation performance in holdover mode is determined by the crystal oscillator's frequency stability characteristics, and the system can continue to provide an accurate high frequency output clock in holdover mode. Note that the jitter transfer function is narrow in this topology and is driven by the narrow band PLL 101.

Note also that in the topology illustrated in FIG. 1, divider circuits can be placed after the oscillators or before the phase detectors to scale the output frequencies according to the needs of the particular implementation.

Figure 2:
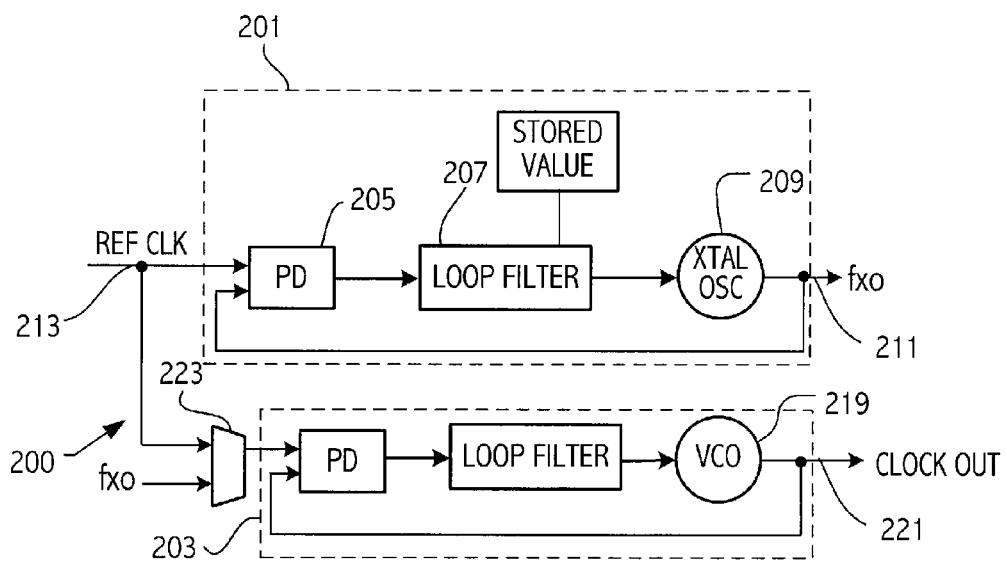
FIG. 2 shows an embodiment in which two PLLs are connected in parallel.

A second topology providing improved holdover performance is illustrated in FIG. 2. FIG. 2 shows a topology 200 in which a first PLL 201 is connected in parallel with a second PLL 203. The first PLL 201 includes phase or phase-frequency detector 205, loop filter 207 and crystal oscillator 209, which in a preferred embodiment is a voltage-controlled, temperature compensated crystal oscillator. The output signal from PLL 201 on node 211 (the output of the crystal oscillator), is fed back to phase detector 205 so that the phase detector locks to the reference clock in normal operational mode.

In the second topology, the second PLL 203 also receives the reference clock supplied on node 213. The second PLL 203 also includes loop filter 207 and a voltage controlled oscillator 219, which may be implemented as a ring oscillator or a VCO utilizing an LC (tank) circuit.

In the topology illustrated in FIG. 2, during normal operation both PLL 201 and 203 independently lock to the reference clock supplied on node 213. When a holdover condition occurs, the loop filter 207 of PLL 201 is frozen. That may be accomplished by storing a value corresponding to the reference clock signals received prior to the occurrence of the holdover mode. For example, a digital value of a voltage driving the crystal oscillator at a time when the reference clock signal was "good", may be stored for use during holdover mode. When the holdover condition occurs, a selector circuit, such as multiplexer 223 selects the output fxo supplied by the crystal oscillator on node 211 as the input to PLL 203.

Figure 3:
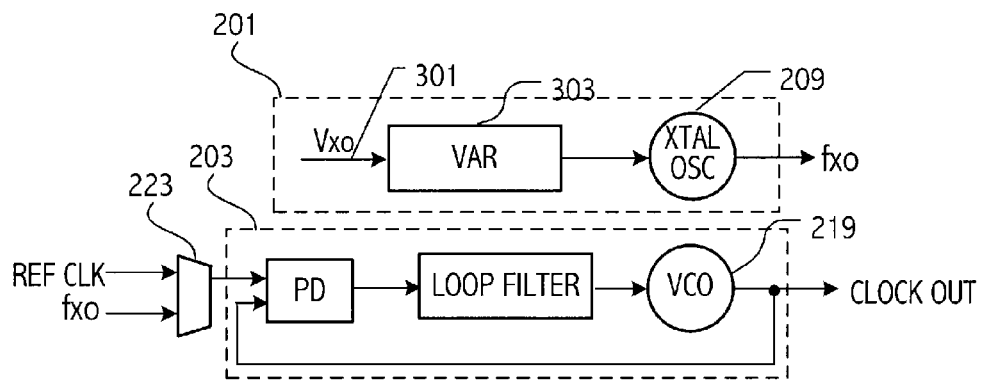
FIG. 3 shows additional details of the embodiment of FIG. 2.

In holdover mode, as illustrated in FIG. 3, the system of the topology illustrated in FIG. 2, operates in the same manner as the system illustrated in FIG. 1. That is, the output of the crystal oscillator is supplied to the phase detector of the second PLL (PLL 103 or PLL 203). In normal operation, PLL 203 locks to the reference clock. The control voltage Vxo, which corresponds to the digital output of the loop filter, is supplied to set the crystal oscillator output to the correct frequency for holdover mode. When a holdover event occurs, in one embodiment, the varactor 301, which may be implemented as an analog or digital varactor, is frozen and the multiplexer at the input to PLL 203 is set to select fxo. In other embodiments, the input to the varactor is kept from updating to ensure the VCO frequency doesn't change so the result is freezing VCO frequency. If the phase of the reference clock and fxo are different, there can be a phase hit at the output. That is, there can be a phase difference between the output clock supplied on node 221 in holdover mode and the clock being supplied in normal operational mode when the PLL 203 is locked to the reference clock prior to the switch to holdover mode. Such a phase hit can be alleviated by utilizing hitless switching techniques as described in application Ser. No. 10/187,935, filed Jul. 2, 2002, entitled "Method and Apparatus for Switching Between Input Clocks In a Phase-Locked Loop", now U.S. Pat. No. 6,741,109, which is incorporated herein by reference.

In normal operation, PLL 101 (and PLL 201) provide better initial accuracy in holdover than PLL 103 (or PLL 203). That is due to the much smaller VCO gain Kv of PLL 101/201 and also because of the lower bandwidth of PLL 101/201. Thus, for the same quantization error, PLL 101/201 shifts less than PLL 103/203.

Figure 4:
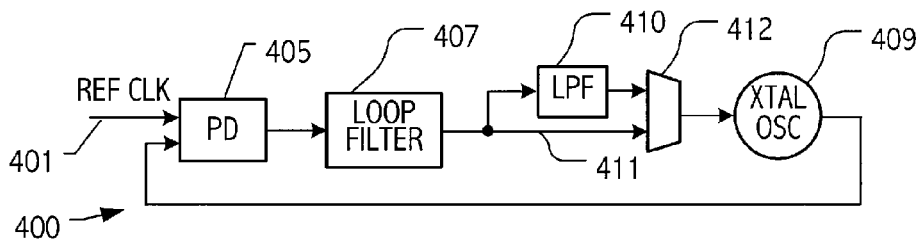
FIG. 4 illustrates an embodiment utilizing a low pass filter to improve initial accuracy.

Referring now to FIG. 4, the accuracy of the initial holdover mode can be further improved by modifying the PLL 101 or 201 as illustrated by PLL 400. The PLL 400 includes phase or phase-frequency detector 405, loop filter 407 and crystal oscillator 409, which in a preferred embodiment is a voltage-controlled, temperature compensated crystal oscillator. When the system goes into holdover mode, i.e., when the reference clock signal supplied on node 401 is lost, the crystal oscillator 409 is driven by the "frozen" output of the loop filter 407. In the embodiment illustrated in FIG. 4, the output of the loop filter is filtered using low pass filter 410. The selector circuit 412 selects whether to supply the filtered output of the loop filter supplied from low pass filter 410 or the output of the loop filter supplied on node 411 according to whether the system is in holdover mode or normal operational mode. The filtered output supplied from low pass filter 410 during holdover mode contains less quantization noise than the "frozen" loop filter output, so the initial accuracy of the output clock in holdover mode will be improved by utilizing the low pass filtered output.

Figure 5:
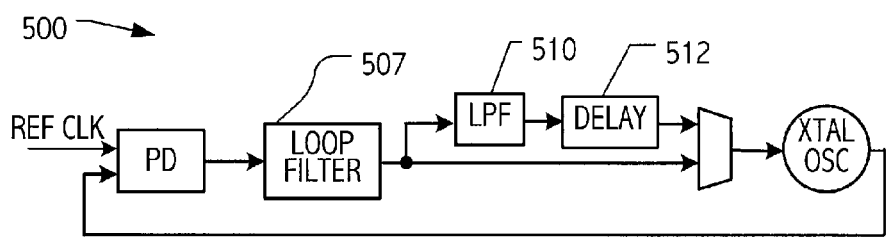
FIG. 5 illustrates an embodiment having a low pass filter and a delay element.

Referring to FIG. 5, another embodiment 500 of the PLL with the crystal oscillator utilizes a delayed (older) and low pass filtered "frozen" value to drive the crystal oscillator. Thus, the output from loop filter 507 is supplied to low pass filter 510, which supplies delay element 512. Using a delayed version of the loop filter output helps to address situations where the reference clock slowly fails, pulling the PLL in the wrong direction for a while before the holdover condition is detected. Note that the order of the delay element and the filter may be reversed in certain implementations. At the time, the system enters holdover, the output of the delay element is frozen and selected by the PLL.

Figure 6:
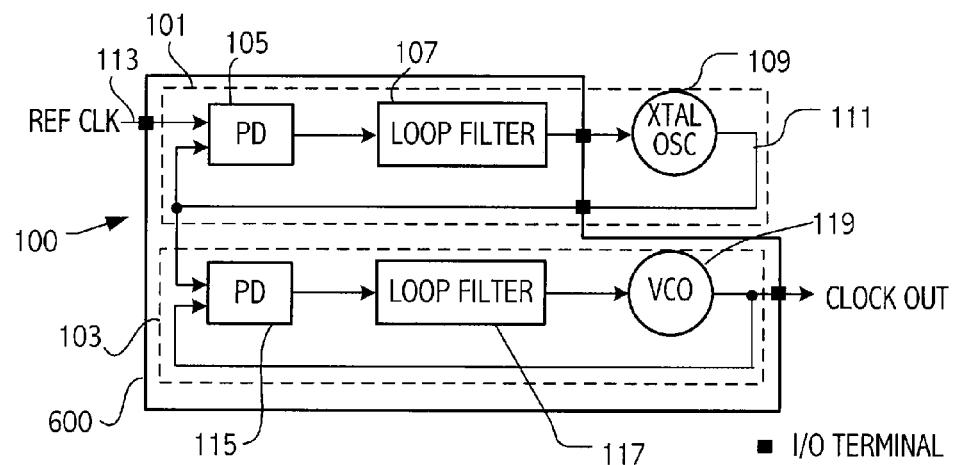
FIG. 6 illustrates an embodiment of FIG. 1 utilizing a single integrated circuit and an external crystal oscillator.
Figure 7:
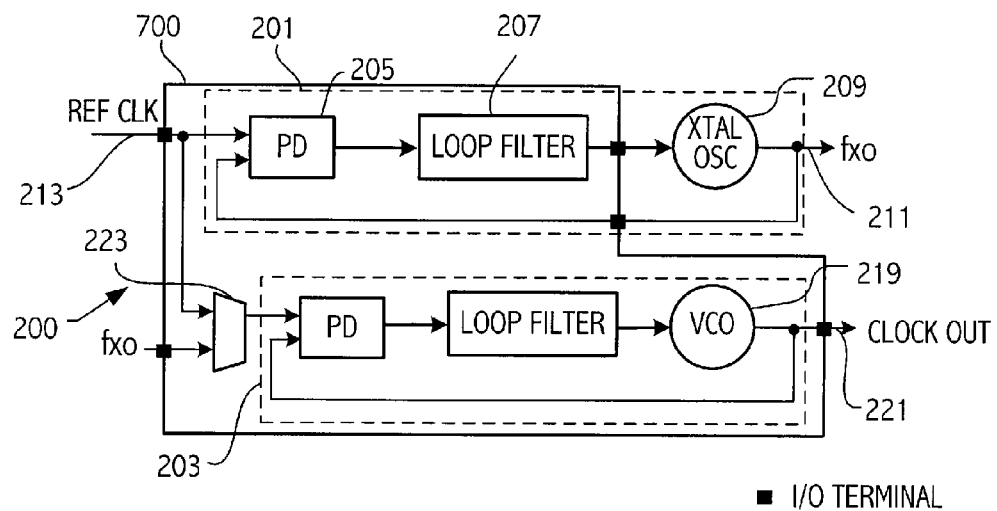
FIG. 7 illustrates an embodiment of FIG. 2 utilizing a single integrated circuit and an external crystal oscillator.

Referring to FIG. 6, an exemplary integrated circuit is shown in which the embodiment illustrated in FIG. 1 is implemented as a single integrated circuit 600 coupled to the external crystal oscillator 109. FIG. 7 illustrates an embodiment of FIG. 2 implemented as a single integrated circuit 700 coupled to the external crystal oscillator 219.

Thus, various embodiments have been described implementing a holdover approach that improves initial accuracy and reduces the susceptibility of the holdover clock to instability caused by, e.g., variations in temperature while allowing the use of cheap, low frequency crystal oscillators and also while allowing the generation of very high speed output clocks (e.g., up into the GHz range). The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. An apparatus comprising:
a first phase-locked loop circuit including a crystal oscillator coupled to receive a reference clock signal in normal operational mode and to supply a first phase-locked loop output signal based on the reference clock signal during the normal operational mode;
a second phase-locked loop circuit coupled to utilize the first phase-locked loop output signal when generating an output clock in a holdover mode and wherein the first phase-locked loop includes a loop filter having outputs that are held in response to the holdover mode to a value corresponding to one or more clock signals received prior to entering the holdover mode and the first phase-locked loop is coupled to utilize the outputs of the loop filter that are held in response to the holdover mode while in holdover mode in generating the first-phase locked loop output signal instead of the reference clock signal; and
wherein the second phase-locked loop is coupled to utilize the first phase-locked loop output signal to generate the output clock during operation in the holdover mode and during the normal operational mode.

2. The apparatus as recited in claim 1 wherein the first phased-lock loop circuit further comprises:
a phase detector coupled to receive a feedback signal from the crystal oscillator and the reference clock and coupled to the loop filter;
a low pass filter coupled to the loop filter and coupled to supply a low pass filtered signal indicative of a desired output frequency of the crystal oscillator in holdover mode; and
a selector circuit coupled to the loop filter and the low pass filter to selectably supply to the crystal oscillator the low pass filtered signal in holdover mode and an output of the loop filter in normal operational mode.

3. The apparatus as recited in claim 1 wherein the first phase-locked loop circuit further comprises:
a phase detector coupled to receive a feedback signal from the crystal oscillator and the reference clock and coupled to the loop filter;
a low pass filter coupled to the loop filter;
a delay circuit coupled to the low pass filter, the delay circuit and the low pass filter combining to supply a delayed filtered signal indicative of a desired output frequency of the crystal oscillator in holdover mode; and
a selector circuit responsive to couple the crystal oscillator to the delayed filtered signal in holdover mode and to couple the crystal oscillator to an output of the loop filter in normal operational mode.

4. The apparatus as recited in claim 1 wherein the second phase-locked loop includes a phase detector, a loop filter and a voltage controlled oscillator and wherein the voltage controlled oscillator includes one of a ring oscillator and an LC tank circuit.

5. The apparatus as recited in claim 1 wherein the first phase-locked loop circuit further comprises means for performing a low pass filter operation on an output of the loop filter and means for selectably coupling the crystal oscillator to one of the output of the loop filter and a low pass filtered output of the loop filter according to the holdover mode.

6. The apparatus as recited in claim 1 wherein the first phase-locked loop circuit further comprises second means coupled between the loop filter and the crystal oscillator for supplying a delayed low pass filtered output of the loop filter to the crystal oscillator in holdover mode.

7. The apparatus as recited in claim 1 wherein the apparatus is a line card in a SONET compliant system.

8. The apparatus as recited in claim 1 wherein the first phased-lock loop circuit further comprises:
a phase detector coupled to receive a feedback signal from the crystal oscillator and the reference clock;
a low pass filter coupled to the loop filter and coupled to supply a low pass filtered signal indicative of a desired output of the crystal oscillator.

9. The apparatus as recited in claim 8 further comprising:
a delay circuit coupled to the low pass filter, the delay circuit and the low pass filter combining to supply a delayed filtered signal indicative of the desired output of the crystal oscillator in holdover mode; and
a selector circuit responsive to couple the crystal oscillator to the delayed filtered signal in holdover mode and to couple the crystal oscillator to an output of the loop filter in normal operational mode.

10. A method for supplying an output clock in holdover mode comprising:
receiving a reference clock in a first phase-locked loop circuit, the first phase-locked loop circuit including a crystal oscillator;
supplying a first phase-locked loop output signal based on the reference clock during normal operational mode;
holding the output of the first phase-locked loop circuit during holdover mode at a level based on a value maintained in the first phase-locked loop circuit corresponding to clocks received by the first phase-locked loop circuit prior to entering the holdover mode such that a control voltage used to drive the crystal oscillator is based on clocks received by the first phase-locked loop circuit prior to entering the holdover mode;

supplying the first phase-locked loop output signal from the crystal oscillator during holdover mode;

in a second phase-locked loop circuit utilizing the first phase-locked loop output signal in holdover mode to generate the output clock; and in the second phase-locked loop circuit utilizing the first phase-locked loop output signal in normal operational mode in generation of an output clock used in the normal operational mode.

11. The method as recited in claim 10 further comprising:
in the first phase-locked loop, performing a low pass filter operation on an output of a loop filter; and
coupling the crystal oscillator to the output of the loop filter in normal operation and to an output of the low pass filter operation in the holdover mode.

12. The method as recited in claim 10 further comprising:
in the first phase-locked loop, coupling a delayed and low pass filtered output of a loop filter to the crystal oscillator in the holdover mode.

13. The method as recited in claim 12 further comprising coupling the output of the loop filter to the crystal oscillator in a normal operational mode.

14. An apparatus comprising:
a first phase-locked loop circuit including a crystal oscillator, the first phase-locked loop circuit being coupled to receive a reference clock and to supply a first phase-locked loop output signal based on the reference clock during normal operational mode and to supply the first phase-locked loop output signal during holdover mode based on a value stored in the first phase-locked loop circuit, and indicative of a desired crystal oscillator output;
first means coupled to first phase-locked loop circuit for generating an output clock in holdover mode utilizing the first phase-locked loop output signal; and
wherein the first phase-locked loop circuit further comprises means for performing a low pass filter operation on an output of a loop filter and means for selectably coupling the crystal oscillator to one of the output of the loop filter and a low pass filtered output of the loop filter according to the holdover mode.

15. An integrated circuit for generating a clock signal comprising:
a first portion of a first phase-locked loop circuit coupled to supply a control signal to an external crystal oscillator, the crystal oscillator forming a second portion of the first phase-locked loop circuit, the first portion of the first phase-locked loop circuit coupled to receive as a feedback signal an output of the crystal oscillator, the output of the crystal oscillator being the first phase-locked loop output signal, the first portion of the first phase-locked loop circuit being coupled to receive a reference clock and to supply the control signal based on the reference clock during normal operational mode;
a second phase-locked loop circuit coupled to utilize the first phase-locked loop output signal when generating an output clock in holdover mode and wherein the first portion of the first phase-locked loop circuit includes a circuit storing a storing a value corresponding to reference clocks received by the first-phase-locked loop circuit prior to holdover mode, the first phase-locked loop circuit coupled to utilize the stored value to generate the control signal for the crystal oscillator in holdover mode; and
wherein the second phase-locked loop utilizes the first phase-locked loop output signal to generate the output clock during operation in the holdover mode and during normal operational mode.

16. The integrated circuit as recited in claim 15 wherein the first portion of the first phased-lock loop circuit further comprises:
a phase detector coupled to receive a feedback signal from the crystal oscillator and the reference clock;
a loop filter coupled to the phase detector;
a low pass filter coupled to the loop filter and coupled to supply a low pass filtered signal indicative of a desired output frequency of the crystal oscillator in holdover mode; and
a selector circuit coupled to the loop filter and the low pass filter to selectably supply as the control signal to the crystal oscillator the low pass filtered signal in holdover mode and an output of the loop filter in normal operational mode.

17. The integrated circuit as recited in claim 15 wherein the first portion of the first phased-lock loop circuit further comprises:
a phase detector coupled to receive the output of the crystal oscillator as a feedback signal and coupled to receive the reference clock;
a loop filter coupled to the phase detector;
a low pass filter coupled to the loop filter;
a delay circuit coupled to the low pass filter, the delay circuit and the low pass filter combining to supply as the control signal a delayed filtered signal indicative of a desired output frequency of the crystal oscillator in holdover mode; and
a selector circuit responsive to supply as the control signal the delayed filtered signal in holdover mode and an output of the loop filter in normal operational mode.

18. The integrated circuit as recited in claim 15 wherein the second phase-locked loop includes a phase detector, a loop filter and a voltage controlled oscillator and wherein the voltage controlled oscillator includes one of a ring oscillator and a tank circuit.

* * * * *

UNITED STATES PATENT AND TRADEMARK OFFICE
CERTIFICATE OF CORRECTION

| | | |
|---|---|---|
| PATENT NO. | : 7,148,753 B1 | Page 1 of 1 |
| APPLICATION NO. | : 10/453990 | |
| DATED | : December 12, 2006 | |
| INVENTOR(S) | : Bruno W. Garlepp and Gerard Pepenella | |

It is certified that error appears in the above-identified patent and that said Letters Patent is hereby corrected as shown below:

Col. 6, line 45 (Claim 8) after "reference clock;" please add -- and --

Col. 8, line 8 (Claim 15) after "storing a" please delete "storing a"

Signed and Sealed this

Twenty-seventh Day of March, 2007

JON W. DUDAS
*Director of the United States Patent and Trademark Office*